US011715805B2

(12) United States Patent
Heiss et al.

(10) Patent No.: US 11,715,805 B2
(45) Date of Patent: Aug. 1, 2023

(54) SEMITRANSPARENT THIN-FILM SOLAR MODULE

(71) Applicant: CNBM RESEARCH INSTITUTE FOR ADVANCED GLASS MATERIALS GROUP CO., LTD., Bengbu (CN)

(72) Inventors: Andreas Heiss, Penzing (DE); Joerg Palm, Munich (DE); Helmut Vogt, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 16/650,860

(22) PCT Filed: Sep. 26, 2018

(86) PCT No.: PCT/CN2018/107516
§ 371 (c)(1),
(2) Date: Mar. 25, 2020

(87) PCT Pub. No.: WO2019/062739
PCT Pub. Date: Apr. 4, 2019

(65) Prior Publication Data
US 2020/0279962 A1 Sep. 3, 2020

(30) Foreign Application Priority Data

Sep. 29, 2017 (EP) .................................. 17194092

(51) Int. Cl.
*H01L 31/0468* (2014.01)
*H01L 31/0463* (2014.01)
*H01L 31/0465* (2014.01)

(52) U.S. Cl.
CPC ...... *H01L 31/0468* (2014.12); *H01L 31/0463* (2014.12); *H01L 31/0465* (2014.12)

(58) Field of Classification Search
CPC ............ H01L 31/0468; H01L 31/0463; H01L 31/0465; H01L 31/022441; H01L 31/055; H01L 31/048; Y02E 10/50
See application file for complete search history.

(56) References Cited

U.S. PATENT DOCUMENTS 4,795,500 A * 1/1989 Kishi .............. H01L 31/022425
136/244
8,853,528 B2 * 10/2014 Sievenpiper .... H01L 31/022441
136/256
(Continued)

FOREIGN PATENT DOCUMENTS

CN 101515609 A 8/2009
CN 101771091 A 7/2010
(Continued)

OTHER PUBLICATIONS

Non-Final Office Action for U.S. Appl. No. 16/650,950, filed Mar. 25, 2020 on behalf of Bengbu Design & Research Institute dated Dec. 24, 2020 14 pages.
(Continued)

*Primary Examiner* — Bethany L Martin
(74) *Attorney, Agent, or Firm* — Bayramoglu Law Offices LLC

(57) ABSTRACT

A thin-film solar module with a substrate and a layer structure applied thereon, which comprises a rear electrode layer, a front electrode layer, and an absorber layer arranged between the rear electrode layer and the front electrode layer, wherein serially connected solar cells are formed in the layer structure by patterning zones, wherein at least one solar cell has one or more optically transparent zones that are in each case rear-electrode-layer-free, wherein the one or (Continued)

Figure 1:
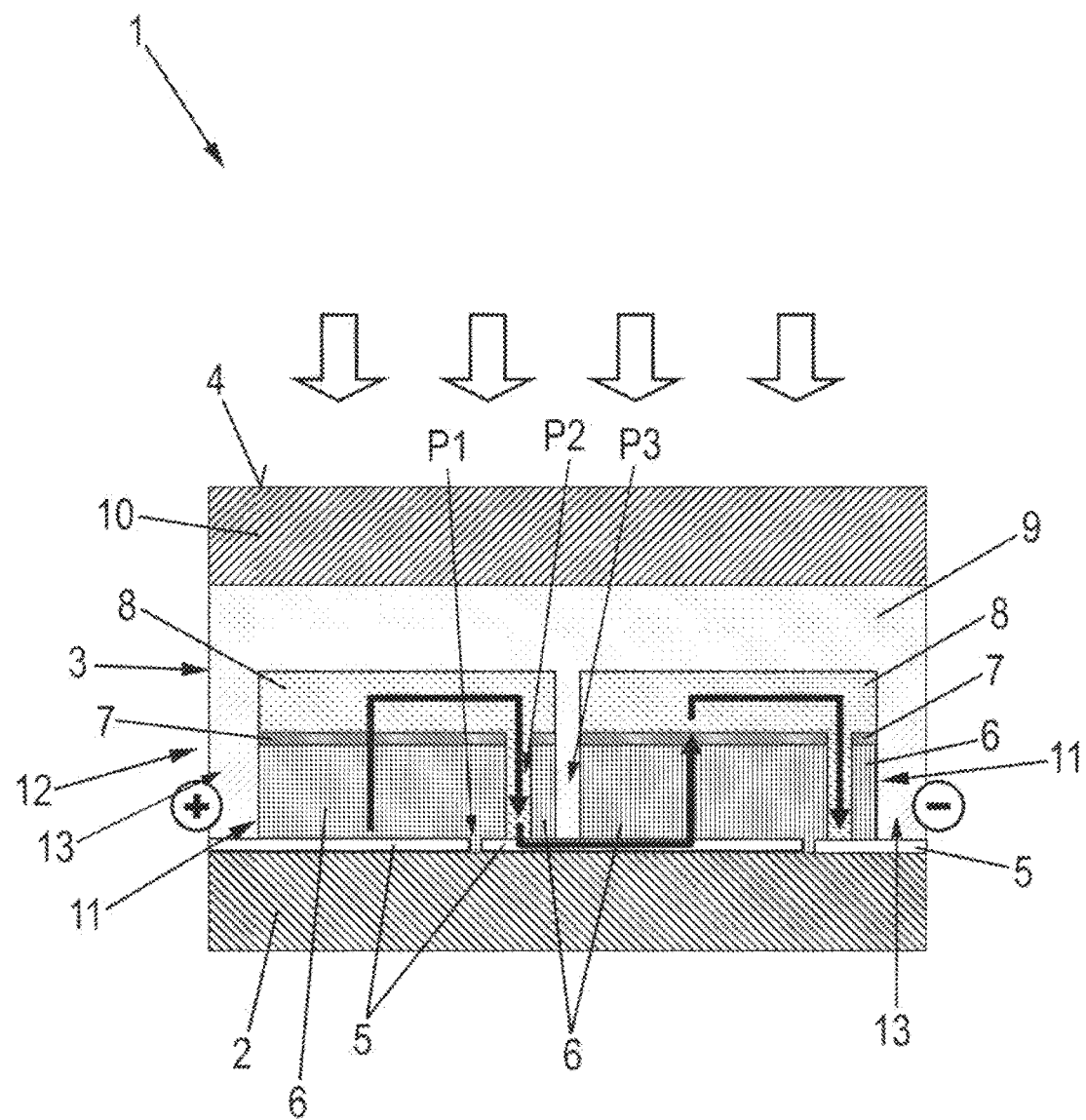

more optically transparent zones are implemented such that the rear electrode layer of the solar cell is continuous.

10 Claims, 5 Drawing Sheets

(56) References Cited

U.S. PATENT DOCUMENTS

| | | | |
|---|---|---|---|
| 2006/0112987 A1* | 6/2006 | Nakata | H01L 31/0468 |
| | | | 136/256 |
| 2009/0205710 A1 | 8/2009 | Kim et al. | |
| 2010/0013037 A1 | 1/2010 | Park et al. | |
| 2011/0011453 A1* | 1/2011 | Kang | H01L 31/046 |
| | | | 438/57 |
| 2012/0103416 A1 | 5/2012 | Kwon et al. | |
| 2012/0295393 A1* | 11/2012 | Lu | H01L 27/1421 |
| | | | 257/E31.119 |
| 2013/0025661 A1* | 1/2013 | Shin | H01L 31/0468 |
| | | | 136/255 |
| 2013/0050418 A1 | 2/2013 | Nishioka et al. | |
| 2013/0319518 A1 | 12/2013 | Doech et al. | |
| 2014/0305492 A1 | 10/2014 | Verger et al. | |
| 2015/0136198 A1 | 5/2015 | Nam | |
| 2016/0126407 A1 | 5/2016 | Cardi et al. | |
| 2016/0211396 A1 | 7/2016 | Karst et al. | |
| 2018/0254365 A1 | 9/2018 | Kim | |
| 2020/0227578 A1 | 7/2020 | Heiss et al. | |
| 2020/0266313 A1 | 8/2020 | Heiss et al. | |

FOREIGN PATENT DOCUMENTS

| | | |
|---|---|---|
| CN | 102970569 A | 3/2013 |
| CN | 103155157 A | 6/2013 |
| CN | 103718307 A | 4/2014 |
| CN | 105140310 A | 12/2015 |
| TW | 201019492 A | 5/2010 |
| WO | 2012/029780 A1 | 3/2012 |
| WO | 2014/188092 A1 | 11/2014 |
| WO | 2015/033291 A1 | 3/2015 |
| WO | 2019/062773 A1 | 4/2019 |
| WO | 2019/062788 A1 | 4/2019 |

OTHER PUBLICATIONS

Restriction Requirement for U.S. Appl. No. 16/650,590, filed Mar. 25, 2020, on behalf of Bengbu Design & Research Institute, dated Oct. 23, 2020. 8 Pages.
International Search Report for International PCT App. No. PCT/CN2018/107516 filed on Sep. 26, 2018 on behalf of Bengbu Design & Research Institute, dated Jan. 3, 2019. 4 Pages.
International Search Report for International PCT App. No. PCT/CN2018/107709 filed on Sep. 26, 2018 on behalf of Bengbu Design & Research Institute, dated Jan. 4, 2019. 3 Pages.
International Search Report for International PCT App. No. PCT/CN2018/107795 filed on Sep. 27, 2018 on behalf of Bengbu Design & Research Institute, dated Nov. 30, 2018. 3 Pages.
Written Opinion for International PCT App. No. PCT/CN2018/107516 filed on Sep. 26, 2018 on behalf of Bengbu Design & Research Institute, dated Jan. 3, 2019. 3 Pages.
Written Opinion for International PCT App. No. PCT/CN2018/107709 filed on Sep. 26, 2018 on behalf of Bengbu Design & Research Institute, dated Jan. 4, 2019. 3 Pages.
Written opinion for International PCT App. No. PCT/CN2018/107795 filed on Sep. 27, 2018 on behalf of Bengbu Design & Research Institute, dated Nov. 30, 2018. 3 Pages.
Restriction Requirement for U.S. Appl. No. 16/649,979, filed Mar. 23, 2020 on behalf of Bengbu Design & Research Institute dated Apr. 5, 2021 9 pages.

* cited by examiner

SEMITRANSPARENT THIN-FILM SOLAR MODULE

CROSS REFERENCE TO RELATED APPLICATIONS

The present application is the U.S. national stage of International Patent Application PCT/CN2018/107516 filed internationally on Sep. 26, 2018, which, in turn, claims priority to European Patent Application No. 17194092.7 filed on Sep. 29, 2017.

In open-space systems, large growth in solar modules can be observed; however, applications in the building-integrated setting are currently still moving in a much smaller scale. In light of intensified efforts toward decentralized energy solutions, a real demand is developing to be able to also use façade surfaces for photovoltaic power generation. For architectonic and structural engineering reasons, both flat opaque solar modules and light permeable solar modules are necessary for integration into buildings. Permeability to visible light averaged over the total area of the solar module in the range from 5 to 50% (optical semitransparency) is desirable in order to have, on the one hand, adequate electrical power and, on the other, to ensure sufficient light transmittance. Other areas of application for semitransparent solar modules are noise abatement walls (roadway, railway), privacy barriers in outdoor areas, or walls for greenhouses.

In contrast to crystalline silicon technology (c-Si), in which the solar cells can, in principle, only be realized opaque, thin-film solar cells have the advantage that as a result of the monolithic serial connection electrically and optically active areas as well as surrounding passive regions can be very flexibly designed. In addition, significantly higher efficiency levels can be achieved by chalcopyrite-based absorbers than with absorbers based on amorphous silicon. One characteristic of the process technology in the production of thin-film solar cells is the sequential execution of full-surface coating and local decoating, wherein, for example, for producing the solar cells, different layers are applied directly onto a carrier substrate, which is glued ("laminated") after patterning of the layers to a front-side transparent cover layer to form a weathering-stable composite. Masking processes, as are customary in microelectronics, are avoided by means of the full-surface coating and local decoating. For large thin-film solar modules, masking processes are very cost intensive and time-consuming.

Until now, primarily thin-film silicon has been used as the starting material for absorbers for producing semitransparent modules, in particular in conjunction with a transparent front electrode and a transparent rear electrode. For this, the absorber has been made so thin that the entire layer system is transparent to electromagnetic radiation in the range of infrared and red wavelengths. However, an undesirable color filter effect develops as a result of the thin absorber.

In contrast, the object of the present invention consists in advantageously improving semitransparent thin-film solar modules known in the prior art as well as their production, wherein the modules should have a relatively large optically active area with noteworthy transparency in the visible light range. Also, the modules should be visually appealing and, in particular, have no color filter effect.

These and other objects are accomplished according to the proposal of the invention by a semitransparent thin-film solar module as well as a method for its production in accordance with the coordinate claims. Advantageous embodiments of the invention are indicated through the features of the subclaims.

In the context of the present invention, the term "transparency" refers to visible-light transmittance of at least 85%. Typically, visible light is in the wavelength range from 380 nm to 780 nm. The term "opacity" refers to visible-light transmittance of less than 5%. Accordingly, an optically transparent zone of a solar cell has visible-light transmittance in the range from 85% to 100%; an opaque zone has visible-light transmittance in the range from 0% (completely opaque) to less than 5%. The term "semitransparency" refers to visible-light transmittance in the range from 5% to less than 85%. In the context of the present invention, the term "semitransparency" is used in connection with visible-light transmittance averaged over the entire area of all solar cells of the thin-film solar module, in other words, the desired semitransparency results from averaging the optical transmisttance of opaque and optically transparent regions over all solar cells of the thin-film solar module.

According to the invention, a semitransparent thin-film solar module with integrated serially connected solar cells is presented. In keeping with the above definition of the term "semitransparency", the thin-film solar module has (optically) opaque and optically transparent regions of the solar cells, wherein the semitransparency of the solar cells is the result of averaging the visible-light transmittance over the entire area of all solar cells. The (semi)transparency of a thin-film solar module can be determined in a simple manner by a measurement arrangement, in which, for example, a white light source (visible light source) is arranged on one side of the thin-film solar module and a detector of visible light is arranged on the other side of the thin-film solar module. It is essential here that the detector can detect the light passing through all solar cells of the thin-film solar module (for example, simultaneously) in order to enable averaging the optical transparency of the thin-film solar module over the entire area of the solar cells.

The thin-film solar module according to the invention comprises a substrate with a layer structure with monolithically integrated serial connection of solar cells for photovoltaic energy generation. In keeping with the customary use of the term "thin-film solar module", it refers to modules with a layer structure with a low thickness of, for example, a few microns such that a carrier substrate is required for adequate mechanical stability. The carrier substrate can be made, for example, of inorganic glass, plastic, or metal, in particular, of a metal alloy, and can be designed, depending on the respective layer thickness and the specific material properties, as a rigid plate or a flexible film. The invention refers both to a thin-film solar module in substrate configuration, wherein, for producing the solar cells, the layer structure is applied on a substrate surface facing the light-incident side as well as to a thin-film solar module in superstrate configuration, wherein the substrate is transparent and the layer structure is applied on a substrate surface facing away from the light-incident side.

In a manner known per se, the layer structure comprises a rear electrode layer, a front electrode layer, and a photovoltaically active absorber layer arranged between the rear electrode and the front electrode layer. Preferably, the absorber layer is made of a chalcopyrite compound, which is, for example, a I-III-VI semiconductor from the group copper indium/gallium disulfide/diselenide $(Cu(In,Ga)(S,Se)_2)$, for example, copper indium diselenide ($CuInSe_2$ or CIS) or related compounds. The absorber layer is typically opaque or, if it is very thin, at least frequency-selectively transparent such that, generally speaking, a certain color filter effect or frequency filter effect occurs. The rear electrode layer is typically opaque. The front electrode layer is typically optically transparent, in particular in the case of thin-film solar modules in substrate configuration, since passage of light to the layer structure must be enabled.

In the layer structure, the integrated serially connected solar cells are formed conventionally by means of patterning zones. Thus, at least the rear electrode layer is subdivided into sections by first patterning lines P1, which sections form the rear electrodes of the solar cells. In addition, at least the absorber layer is subdivided into sections by second patterning lines P2, which sections are in each case absorbers associated with the solar cells, and at least the front electrode layer is subdivided into sections by third patterning lines P3, which sections form the front electrodes of the solar cells. Solar cells adjacent one another are electrically connected serially to one another via the second patterning lines P2, wherein the front electrode of one solar cell is electrically connected to the rear electrode of the adjacent solar cell and typically, but not mandatorily, directly contacts it.

The patterning lines are, generally speaking, arranged in the order P1-P2-P3. A patterning zone is formed by a direct sequence of first to third patterning line P1-P2-P3. The patterning zone can be, for example, linear, in particular, rectilinear. The patterning lines are, generally speaking, arranged parallel to one another in the sequence comprising the first to third patterning line P1-P2-P3 and run, for example, parallel to one edge of a rectangular or square module. For example, the patterning lines P1-P2-P3 can in each case extend all the way to the edge of the layer structure. The direction of extension of the patterning lines P1-P2-P3 can be defined as module or solar cell width; the direction perpendicular thereto, as module or solar cell length. Each solar cell has, for example, a width that corresponds to the width of the layer structure.

In keeping with the common use of the term, "solar cell" refers, in the context of the present invention, to a region of the layer structure (hereinafter also referred to as "layer region") that has a section of the front electrode layer that forms the front electrode of the solar cell, a section of the absorber layer that forms the photovoltaically active absorber of the solar cell, and a section of the rear electrode layer that forms the rear electrode of the solar cell, and is delimited by two patterning zones directly adjacent one another, consisting in each case of the patterning lines P1-P2-P3. This applies by analogy in the edge region of the module, wherein, instead of a patterning zone, there is a connection section for electrically contacting the serial connection of the solar cells such that the solar cell is defined by the layer region with a front electrode, absorber, and rear electrode, which is situated between a patterning zone and the immediately adjacent connection section. Typically, the layer region extends along the complete length of the adjacent patterning zone(s). Each patterning zone forms a photovoltaically inactive (dead) zone, whereas, in contrast, the layer region has a (single) photovoltaically active zone and is photovoltaically active.

Each patterning zone forms a photovoltaically inactive (dead) zone, whereas, in contrast, the layer region has a (single) photovoltaically active zone and is photovoltaically active. The layer region can, in particular, also have photovoltaically inactive zones, provided according to the invention in the case of at least one layer region of the thin-film solar module. If the layer region has, in addition to the photovoltaically active zone, no photovoltaically inactive zones, the layer region and the photovoltaically active zone are identical. Otherwise, the layer region is composed of the photovoltaically active zone and one or more photovoltaically inactive zones.

According to the present invention, at least one layer region of the thin-film solar module, in other words, at least one solar cell, has, in addition to the photovoltaically active zone, one or more optically transparent zones that are, in order to achieve the desired optical transparency, in each case rear-electrode-layer-free. Advantageously, the optically transparent zones are, for this purpose, also absorber-layer-free. Due to the lack of a rear electrode layer and the optional lack of an absorber layer, high visible-light transmittance of at least 85% can be obtained in the optically transparent zones. Since at least the rear electrode layer is lacking, the optically transparent zones are photovoltaically inactive.

It is essential here for the one or more optically transparent zones of the solar cell to be implemented such that the section of the rear electrode layer belonging to the solar cell and defined by the patterning zones which is the rear electrode of the solar cell is (areally) continuous and not completely subdivided. Each solar cell of the thin-film solar module thus has an areally continuous rear electrode or rear electrode layer (i.e., a section of the rear electrode layer belonging to the solar cell). This assumes that none of the optically transparent zones is implemented such that it extends over the complete solar cell. The serially connected solar cells are thus not subdivided into multiple solar cells strings. If a solar cell has a plurality of optically transparent zones, a section of the photovoltaically active zone is always situated between two optically transparent zones directly adjacent one another.

Preferably, but not mandatorily, the one or more optically transparent zones of a solar cell are additionally implemented such that the absorber layer of the solar cell is (areally) continuous.

In addition to the advantageous optical semitransparency, other advantageous effects can be achieved by the continuous rear electrode layer. In particular, the major problem of high sensitivity to local shading of photovoltaically active regions is avoided, since the photovoltaically active zones of the solar cells can be implemented comparatively large and, in particular, for producing the optical semitransparency, no lines completely subdividing the solar cells, by means of which the solar cells are subdivided into multiple parallel solar cells strings, have to be formed. Another important effect is the avoidance of hot spots, i.e., sites of local overheating due to high current density. In addition, the disadvantageous effects of layer inhomogeneities can be avoided since the continuous rear electrode serves as an electrically compensating potential surface.

Advantageously, multiple solar cells, in particular all solar cells, of the thin-film solar module have in each case one or more optically transparent zones which, in particular, can be arranged in a linear manner. Advantageously, at least one solar cell, in particular plural solar cells, has a plurality of optically transparent zones, in particular arranged in a linear manner. An optically transparent zone can, in particular, be embedded in the layer region, be arranged peripherally to the layer region, protrude into a patterning zone, or extend completely over a patterning zone. According to an embodiment, there is at least one patterning zone, wherein an optically transparent zone protrudes or extends completely over this patterning zone.

Advantageously, the ratio of the total area of all optically transparent zones to the total area of all solar cells of the thin-film solar module is in the range from 5% to 50%. The optical transparency for visible light averaged over the thin-film solar module is preferably in the range from 5% to 50% and is, in particular, 20%. In this manner, on the one hand, relatively high electrical output can be achieved while, on the other, the optical transmittance is adequately high for practical applications such that a good compromise for the conflicting properties of "output" and "optical transparency" can be achieved.

In a particularly advantageous embodiment of the thin-film solar module according to the invention, at least one optically transparent zone is at least partially, in particular, completely, surrounded by an immediately adjacent edge zone that is absorber-layer-free but has a rear electrode layer. When a thermal laser process is used for a decoating process for producing an optically transparent zone, for example, by using a pulsed laser beam with a pulse duration in the range from 5 to 50 nanoseconds, the risk generally exists for short-circuit current paths ("shunts") to develop on the edges of the decoated areas, increasing power losses. This disadvantageous effect can be avoided by partial decoating in the edge zones, and the efficiency of the module can be advantageously improved.

According to the invention, it is preferable for the ratio of the total area of the optically transparent zones to the total area of the edge zones to be greater than 1, preferably greater than 10. By this means, the advantageous effects mentioned can be achieved satisfactorily without sustaining excessive power loss through the photovoltaically inactive edge zones.

According to the invention, it is preferable for a plurality of solar cells to have in each case a plurality of optically transparent zones such that the advantages according to the invention (semitransparency and advantageous electrical effects) are quite pronounced.

According to the invention, it is preferable for a plurality of optically transparent zones to be arranged linearly along at least one (imaginary) line. This linear arrangement of optically transparent zones can, for example, be arranged perpendicular (i.e., at an angle of 90°) or parallel (i.e., at an angle of 0°) to the patterning zones. It is, however, also possible for the linear arrangement of optically transparent zones to be arranged at an angle different from 0° or 90° oblique to the patterning zones. Generally speaking, the linear arrangement of optically transparent zones has the process-technology advantage that the optically transparent zones can be realized particularly simply, quickly, and economically by linear movement of a tool for producing the optically transparent zones. According to an embodimend having a linear arrangement of optically transparent zones extening over plural patterning zones there is at least one patterning zone having an optically transparent zone the protrudes into the optically transparent zone or extends completely over the optically transparente zone.

Advantageously, a plurality of optically transparent zones are arranged along a plurality (large group) of mutually parallel (imaginary) lines. It can also be advantageous for a plurality of optically transparent zones to be arranged along at least two such large groups, which have in each case a plurality of mutually parallel (imaginary) lines, wherein the lines of different groups are oriented at mutually different angles relative to the patterning zones. By means of this measure, a particularly good overall visual impression of the thin-film solar module can be achieved.

Advantageously, at least one linear arrangement of optically transparent zones extends over a plurality of solar cells, by which means a particularly good overall impression of the thin-film solar module can be achieved.

The optically transparent zones can, in principle, have any shape. For example, the optically transparent zones are in each case linear, punctiform, circular disc-shaped, or square. Particularly advantageously, the optically transparent zones are, for example, arranged distributed checkerboard-like over at least one solar cell.

The invention further extends to a method for producing a thin-film solar module implemented as described above.

First, a flat substrate is provided. A rear-electrode-layer is deposited on one side of the substrate. The rear electrode layer can be deposited directly onto a surface of the substrate. Alternatively, at least one additional layer can be situated between the substrate and the rear electrode layer. An absorber layer is deposited over the rear electrode layer. The rear electrode layer is situated between the substrate and the absorber layer. The absorber layer can be deposited directly onto one surface of the rear electrode layer. Alternatively, at least one additional layer can be situated between the rear electrode layer and the absorber layer. A front electrode layer is deposited over the absorber layer. The absorber layer is situated between the front electrode layer and the rear electrode layer. The front electrode layer can be deposited directly onto a surface of the absorber layer. Alternatively, at least one additional layer can be situated between the front electrode layer and the absorber layer. Typically, at least one buffer layer is situated between the absorber layer and the front electrode layer. A layer structure is formed by the layer sequence at least consisting of the rear electrode layer, the absorber layer, and the front electrode layer.

At least the rear electrode layer is patterned (subdivided) by first patterning lines (P1). The patterning of the rear rear electrode layer is typically, but not mandatorily, done before depositing the absorber layer. At least the absorber layer is patterned (subdivided) by second patterning lines (P2). The patterning of the absorber layer is typically, but not mandatorily, done before depositing the front electrode layer. At least the front electrode layer is patterned (subdivided) by third patterning lines (P3). The creation of the patterning lines is typically done in the order: P1-P2-P3. A direct sequence of a first patterning line (P1), a second patterning line (P2), and a third patterning line (P3) forms a patterning zone (14), with a monolithic serial connection of solar cells being formed by the patterning zones. The solar cells have in each case a rear electrode layer section, due to the subdivision of the rear electrode by the first patterning lines (P1).

According to the invention, one or more optically transparent zones, which are in each case rear-electrode-layer-free, are produced by section-wise removal at least of the rear electrode layer for at least one solar cell such that the rear electrode layer of the solar cell is continuous. Optionally, the edge zones surrounding optically transparent zones in each case, which edge zones are in each case absorber-layer-free but have a rear electrode layer section, are produced by section-wise removal at least of the absorber layer.

According to one embodiment of the method according to the invention, the optically transparent zones are produced by section-wise removal at least of the rear electrode layer by irradiation with a pulsed laser beam and/or by mechanical material removal.

According to another embodiment of the method according to the invention, the edge zones are produced by section-wise removal at least of the absorber layer by irradiation with a pulsed laser beam and/or mechanical material removal.

Generally speaking, the optically transparent zones can be produced before making the patterning zones, in other words, during the process of the formation and monolithic serial connection of the solar cells, or after making the patterning zones, in other words, after producing the monolithic serial connection of the solar cells. The same is true for the optionally produced edge zones, which can be produced during or after making the patterning zones.

In an advantageous embodiment of the invention, the optically transparent zones are produced before making the patterning zones, and, possibly, the optional edge zones are produced after making the patterning zones.

Advantageously, such a method includes a step in which the optically transparent zones are produced by section-wise removal at least of the rear electrode layer before depositing the absorber layer. The decoating of the rear electrode layer is preferably done by irradiation with a laser beam. The method optionally includes a further step in which the edge zones are produced after depositing the absorber layer and front electrode layer, as well as after producing the third patterning lines (P3), by section-wise removal at least of the absorber layer and the front electrode layer. The decoating of the absorber layer and the front electrode layer is preferably done by mechanical material removal.

In another advantageous embodiment of the invention, the optically transparent zones, as well as, optionally, the edge zones, are produced only after making the patterning zones, in other words, after producing the monolithic serial connection of the solar cells. This procedure has the advantage that serial connections of solar cells of thin-film solar modules produced conventionally can be subjected to the method according to the invention in order to provide the thin-film solar modules with the desired semitransparency. The methods already used for producing serially connected solar cells can advantageously be retained.

Advantageously, such a method for producing optically transparent zones that are surrounded by edge zones includes a step in which at least the absorber layer is removed in sections in processing zones. The processing zones correspond in their dimensions in each case to the dimensions of the optically transparent zone and edge zones to be produced. Here, the optically transparent zones are produced in the inner regions of the processing zones and the edge zones are produced in edge regions of the processing zones surrounding the inner region in each case. Layer removal in the processing zones is preferably done by mechanical material removal. The method includes a further step wherein at least the rear electrode layer is removed in the inner regions of the processing zones, by which means the optically transparent zones are produced. The edge regions, which surround the rear-electrode-layer-free inner regions of the processing zones, form the absorber-layer-free edge zones, which do however have a section of the rear electrode layer. Layer removal in the inner regions is preferably done by irradiation with a pulsed laser beam.

According to one embodiment of the invention, the optically transparent zones are produced by irradiation at least of the rear electrode layer, in particular of the layer structure, with a pulsed laser beam, with the pulses having a pulse duration of less than 1 nanosecond. Alternatively, the optically transparent zones are produced by irradiation at least of the rear electrode layer, in particular of the layer structure, with a pulsed laser beam, with the pulses having a pulse duration of at least 1 nanosecond. Also conceivable is mechanical material removal, for example, by needle writing, brushing, or scraping. Preferably, a pulsed laser beam, whose pulse has a duration of less than 1 nanosecond, particularly preferably less than 100 picoseconds, is used for producing the optically transparent zones. As experiments by the inventors revealed, the use of laser pulses with a longer pulse width in the range, for example, from 5 to 50 nanoseconds result in local damaging of the layer structures due to high heat influx into the absorber layer and the production of fused connections between the front and the rear electrode layer. Surprisingly, it was advantageously possible to significantly reduce these disadvantageous effects through the use of laser pulses with a duration of less than 1 nanosecond.

Preferably, even the edge zones can be produced by irradiation at least of the absorber layer with a pulsed laser beam, wherein the pulses have a pulse duration of less than 1 nanosecond. Alternatively, layer removal can be done by mechanical material removal, for example, by needle writing, brushing, or scraping. Particularly advantageously, a laser beam whose pulses have a duration of less than 1 nanosecond, preferably less than 100 picoseconds, is also used for producing the edge zones surrounding the optically transparent zones, in order to avoid producing fused connections.

The selective removal of layers in the layer structure using a laser beam for producing optically transparent zones as well as, optionally, edge zones can be achieved, in particular, by altering one or more of the following process parameters:
  laser power,
  traveling speed of the laser beam relative to the irradiated surface of the layer structure or substrate,
  laser pulse repetition rate,
  pulse duration,
  on- or off-period of the laser.

In particular, the depth of the hole produced in particular in the layer structure can be varied by spatial overlapping of laser pulses, by which means, for example, in the case of edge zones, essentially, only the layers above the rear electrode layer can be removed.

The production of transparent zones and edge zones by means of laser pulses can be done, for example, in a single-stage procedure during a single process step, for example, by changing the process parameters irradiation power and/or repetition rate of the laser pulses. Here, in each case an optically transparent zone and then an edge zone are produced. Also possible, however, is a two-stage procedure wherein all optically transparent zones are produced in a first process step and all edge zones are produced in a further process step with altered process parameters. Here, the order is irrelevant.

In an embodiment of the invention advantageous in terms of cost, the optically transparent zones in the layer structure (i.e., making the patterning zones) are produced using a pulsed laser beam of a laser beam source, wherein the pulses of the laser beam have a pulse duration of more than 1 nanosecond, in particular in the range from 5 to 50 nanoseconds. Then, optionally, the edge zones are produced using a pulsed laser beam of a laser beam source wherein the pulses of the laser beam have a duration of less than 1 nanosecond, preferably less than 100 picoseconds. Alternatively, the edge zones, can be produced using mechanical material removal in the layer structure, for example, by needle writing, brushing, or scraping. Preferable for economic reasons is the use of mechanical material removal in the layer structure for producing the edge zones.

In the method according to the invention, layer removal in the layer structure (after making the patterning zones) can be done by irradiation from the side of the layer structure using a pulsed laser for producing the optically transparent zones, as well as, optionally, edge zones. Alternatively, layer removal can be done through a transparent substrate ("ablation"). To this end, the layer structure is applied on a transparent substrate, for example, glass. During ablation, the laser energy introduced is absorbed on the rear electrode layer, with a small part of the rear electrode vaporizing, such that the rear electrode layer with the complete layer structure above it bulges due to the expanding gas. This happens until the bulged region breaks off from the surrounding layer stack in a circular shape. As a result of the breaking off, the edges of the circular region remain shunt free since no appreciable laser energy has melted this edge region or even fused rear and front electrodes. In this manner, transparent zones with a relatively small proportion of shunt paths can be produced, by which means performance losses of the module can be reduced.

Advantageously, the optically transparent zones can be produced by section-wise removal at least of the rear electrode layer using a pulsed laser beam with a pulse duration of less than 1 nanosecond, wherein it is particularly advantageous for the laser beam to strike the transparent substrate directly, to penetrate the substrate, and for layer removal to be done by ablation. Layer removal is thus done through the transparent substrate.

The various embodiments of the invention can be realized individually or in any combinations. In particular, the features mentioned above and to be explained in the following can be used not only in the combinations indicated but also in other combinations or in isolation without departing from the scope of the invention.

Figure 2:
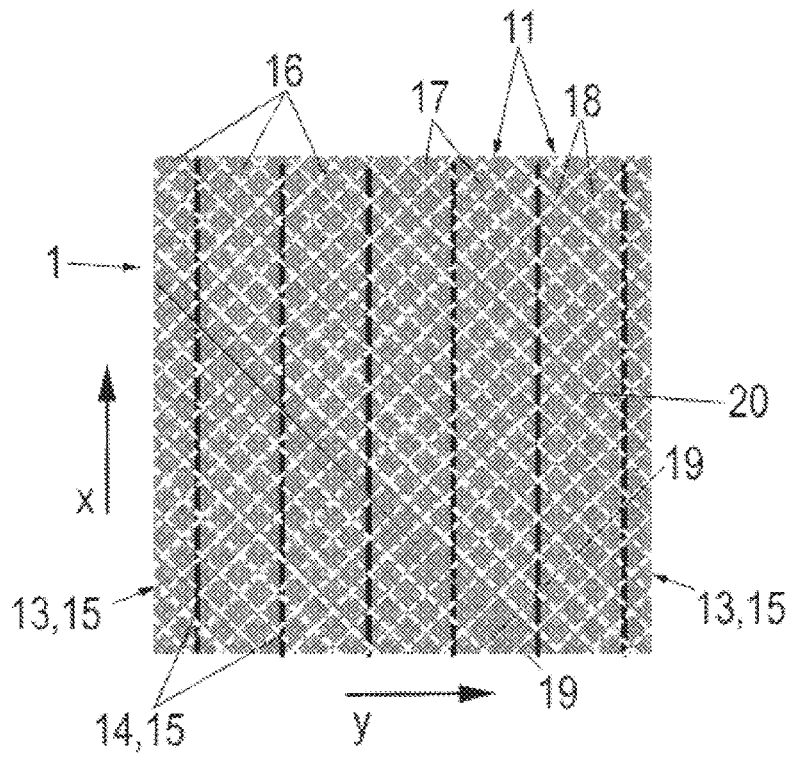
Figure 3:
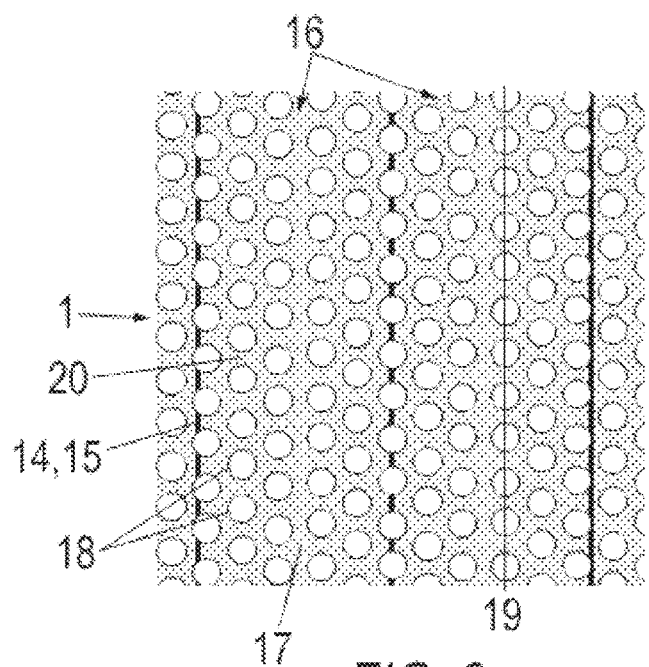
Figure 4:
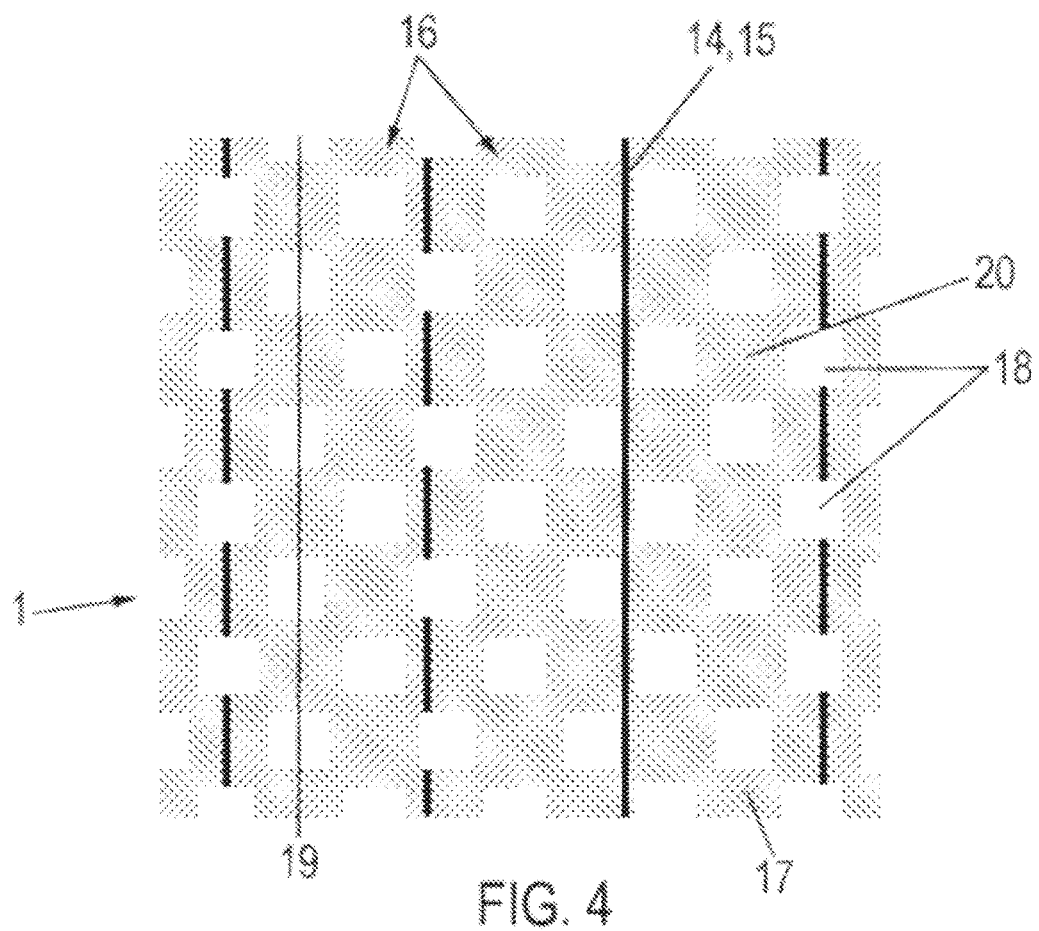
Figure 5:
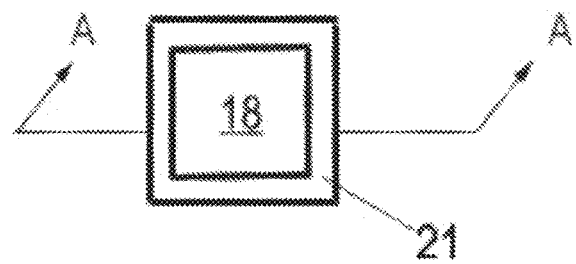
Figure 6:
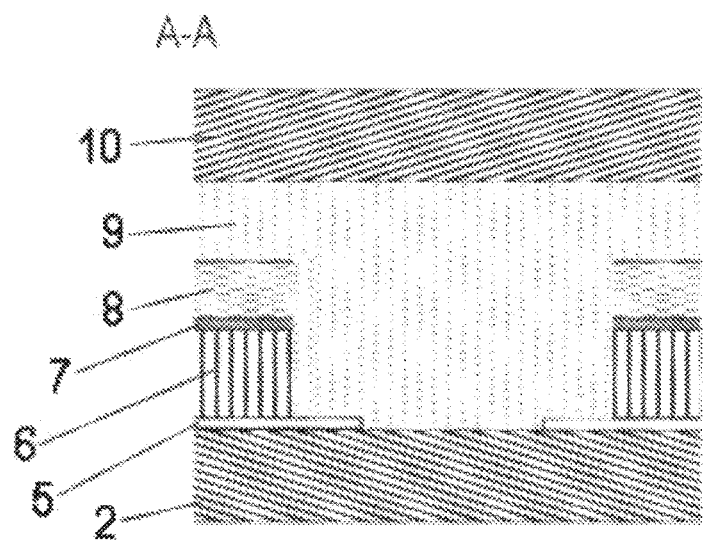
Figure 7:
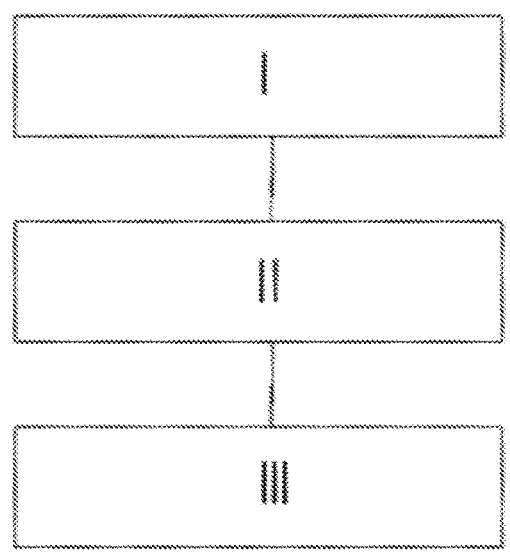

The invention is now explained in detail using exemplary embodiments and referring to the accompanying figures. They depict, in simplified, not to scale representation:

FIG. 1 a schematic representation of the integrated serial connection of solar cells according to one embodiment of the thin-film solar module according to the invention in cross-section;

FIG. 2 a schematic representation of an exemplary embodiment of the thin-film solar module according to the invention in plan view;

FIG. 3 a schematic representation of another exemplary embodiment of the thin-film solar module according to the invention in plan view;

FIG. 4 a schematic representation of another exemplary embodiment of the thin-film solar module according to the invention in plan view;

FIG. 5 a schematic representation of an optically transparent zone with a surrounding edge zone;

FIG. 6 a cross-sectional view of the optically transparent zone and edge zone of FIG. 5 along section line A-A;

FIG. 7 a flowchart to illustrate an exemplary embodiment of the method according to the invention.

DETAILED DESCRIPTION OF THE DRAWINGS

FIG. 1 schematically illustrates a thin-film solar module according to the present invention referenced as a whole with the number 1 using a cross-sectional view. The thin-film solar module 1 comprises a plurality of solar cells 11 serially connected one to another in integrated form, wherein in a greatly simplified manner only two solar cells 11 are depicted. Of course, generally speaking, in the thin-film solar module 1, a large number of solar cells 11 (for example, approximately 100-150) are serially connected.

The thin-film solar module 1 has a composite pane structure in substrate configuration, in other words, it has a first substrate 2 with a layer structure 3 made of thin films applied thereon, wherein the layer structure 3 is arranged on a light-entry side surface of the first substrate 2. Here, the first substrate 2 is implemented, for example, as a rigid glass plate with relatively high light transmittance, while other electrically insulating materials with desired stability and inert behavior relative to the process steps carried out can equally be used.

The layer structure 3 includes, arranged on the light-entry side surface of the first substrate 2, an opaque rear electrode layer 5, which is made, for example, from a light-impermeable metal such as molybdenum (Mo) and was applied on the first substrate 2 by vapor deposition or magnetron-enhanced cathodic sputtering (sputtering). The rear electrode layer 5 has, for example, a layer thickness in the range from 300 nm to 600 nm.

A photovoltaically active (opaque) absorber layer 6 that is made of a semiconductor doped with metal ions whose bandgap is capable of absorbing the greatest possible share of sunlight is applied on the rear electrode layer 5. The absorber layer 6 is made, for example, of a p-conductive chalcopyrite compound semiconductor, for example, a compound of the group $Cu(In/Ga)(S/Se)_2$, in particular sodium (Na)-doped $Cu(In/Ga)(S/Se)_2$. The preceding formulas are understood to mean that indium (In) or gallium (Ga) as well as sulfur (S) or selenium (Se) can be present alternatively or in combination. The absorber layer 6 has a layer thickness that is, for example, in the range from 1 to 5 µm and is, in particular, approx. 2 µm. Typically, for the production of the absorber layer 6, various material layers are applied, for example, by sputtering, and are subsequently thermally converted to form the compound semiconductor by heating in a furnace (RTP=rapid thermal processing), optionally, in an atmosphere containing S— and/or Se. This manner of production of a compound semiconductor is well known to the person skilled in the art such that it need not be discussed in detail here.

Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1.

A front electrode layer 8 is applied on the buffer layer 7, for example, by sputtering. The front electrode layer 8 is transparent to radiation in the visible spectral range ("window electrode") such that the incoming sunlight (depicted in FIG. 1 by four parallel arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. A heterojunction (i.e., a sequence of layers of opposing conductor type) is formed by the front electrode layer 8 together with the buffer layer 7 and the absorber layer 6. The buffer layer 7 can effect electronic adaptation between the absorber layer 6 and the front electrode layer 8.

For the formation and serial connection of the solar cells 11, the layer structure 3 was patterned using suitable patterning technology, for example, laser lithography and/or mechanical removal. Typically, a plurality of immediate sequences of three patterning lines P1-P2-P3 in each case in the form of layer ditches are introduced into the layer structure 3 in this order. Here, at least the rear electrode 5 is subdivided by first patterning lines P1; at least the absorber layer, by second patterning lines P2; and at least the front electrode layer 8, by third patterning lines P3 by production of respective ditches. Via the second patterning lines P2, the front electrode layer 8 of one solar cell 11 is in each case electrically conductively connected to the rear electrode layer 5 of an adjacent solar cell 11, with the front electrode layer 8 directly contacting the rear electrode layer 5, for example. In the exemplary embodiment depicted, the ditches of the first patterning lines P1 are filled by material of the absorber layer 6. The ditches of the second patterning lines P2 are filled by material of the front electrode layer 8, and the ditches of the third patterning lines P3 are filled by the adhesive layer 9 mentioned in the following. Each immediate sequence of a first, second, and third patterning line P1-P2-P3 forms a patterning zone 14. In FIG. 1, by way of example, only a single patterning zone 14 is depicted, by means of which the serial connection of two adjacent solar cells 11 is defined, wherein it is understood that in the thin-film solar module 1, a large number of such patterning zones 14 are provided for the patterning and serial connection of solar cells 11.

In the exemplary embodiment depicted here, both the positive power connector (+) and the negative power connector (−) of the thin-film solar module 1 are routed via the rear electrode layer 5 and electrically contacted there. For this purpose, the layers of the layer structure 3 are removed all the way to the rear electrode layer 5 in the two peripheral connection sections 13 of the thin-film solar module 1.

For protection against environmental influences, a (plastic) adhesive layer 9 that serves to encapsulate the layer structure 3 is applied on the front electrode layer 8. Adhesively bonded with the adhesive layer 9 is a second substrate 10 transparent to sunlight that is implemented, for example, in the form of a glass sheet made of extra white glass with a low iron content, with the equally possible use of other electrically insulating materials with desired strength and inert behavior relative to the process steps carried out. The second substrate 10 serves for the sealing and for the mechanical protection of the layer structure 3. The thin-film solar module 1 can absorb light via the front-side module surface 4 of the second substrate 10 in order to produce an electrical voltage on the two power connectors (+,−). A resulting current path is depicted in FIG. 1 by serially arranged arrows.

The two substrates 2, 10 are fixedly bonded ("laminated") to one another via the adhesive layer 9, with the adhesive layer 9 implemented here, for example, as a thermoplastic adhesive layer, which can be reshaped plastically by heating and which fixedly bonds the two substrates 2, 10 to one another during cooling. The adhesive layer 9 is made here, for example, of PVB. Together, the two substrates 2, 10 with the solar cells 11 embedded in the adhesive layer 9 form a laminated composite 12.

Reference is now made to FIGS. 2 and 3, wherein, in each case, schematic representations of exemplary embodiments of the thin-film solar module 1 according to the invention are depicted in plan view. The two thin-film solar modules 1 have in each case an integrated serial connection of solar cells 11, as were described with reference to FIG. 1.

Considering FIG. 2 first: The square or typically rectangular shape of the thin-film solar module 1 is discernible in plan view. The patterning zones 14 are depicted in each case as straight lines. The patterning zones 14 form in each case a photovoltaically inactive dead zone 15 that can make no contribution to energy production. As depicted in FIG. 2, the patterning zones 14 are in each case arranged parallel to the module edge, here, for example, in x-direction, which can also be referred to as the width of the thin-film solar module 1. The y-direction perpendicular thereto can be referred to as the length of the thin-film solar module 1. The peripheral connection sections 13 depicted in FIG. 1 are not shown in detail in FIG. 2. The two connection sections 13 also form in each case a photovoltaically inactive dead zone that can make no contribution to energy production.

Situated on both sides adjacent a patterning zone 14 is, in each case, a layer region 16 of the layer structure 3, which, in the context of the present invention, defines a solar cell 11. Each solar cell 11 has a (single) photovoltaically active zone 17. The photovoltaically active zone 17 of a solar cell 11 comprises respective sections of the rear electrode layer 5, absorber layer 6, buffer layer 7, and front electrode layer 8, which are the rear electrode, absorber, and front electrode of the solar cell 1. In the inner region of the thin-film solar module 1, each layer region 16 (in other words, solar cell 11) is arranged between two immediately adjacent patterning zones 14 and is delimited thereby. In the case of the two peripheral solar cells 11, the layer region 16 is, in each case, arranged between a patterning zone 14 and the adjacent connector section 13 and is delimited thereby. The layer regions 16 extend in x-direction in each case over the complete dimension of the adjacent patterning zones 14.

According to the invention, at least one layer region 16, in other words, at least one solar cell 11, has, in addition to the photovoltaically active zone 17, a plurality of photovoltaically inactive, optically transparent zones 18, which are in each case rear-electrode-layer-free, for achieving the desired optical transparency of the thin-film solar module 1. Preferably, the optically transparent zones 18 are also absorber-layer-free. The layer regions 16 thus include the (opaque) photovoltaically active zone 17 and a plurality of optically transparent zones 18.

In the exemplary embodiment of FIG. 2, all solar cells 11 have optically transparent zones 18. The optically transparent zones 18 are arranged over the thin-film solar module 1 along imaginary (e.g., straight) lines 19, with the optically transparent zones 18 either embedded in the layer region 16, arranged peripherally to the layer region 16, protruding into a patterning zone 14, or extending over a patterning zone 14. The optically transparent zones 18 are arranged along a first large group of mutually parallel lines 19, which are oriented in each case at an angle of 45° to the patterning zones 14, as well as along a second large group of mutually parallel lines 19, which are oriented at an angle of 135° to the patterning zones 14. Thus, the linear arrangements of the optically transparent zones 18 cross at an angle of 90°. By way of example, two lines 19, along which the optically transparent zones 18 are arranged, are drawn in. The lines 19 serve only for illustration and are not part of the thin-film solar module 1.

It is essential here that the optically transparent zones 18 are implemented such that the rear electrode layer 5 of each solar cell 11 (i.e., the rear electrode of the solar cell 11) is areally continuous and is not completely subdivided by the optically transparent zones 18. Thus, in no layer region 16 are sections of the rear electrode layer 5 spatially separated from one another produced by the optically transparent zones 18. In particular, no layer region 16 is subdivided into multiple photovoltaically active zones separated from one another such that no splitting of the solar cells 11 into multiple solar cell strings occurs. A region or zone section 20 of the photovoltaically active zone 17 is always situated between two optically transparent zones 18 that are arranged in one and the same layer region 16 along one and the same line 19. In addition, in each layer region 16, the absorber layer 6 is preferably, but not mandatorily, continuous.

Here, the optically transparent zones 18 themselves have, for example, in each case, a linear shape. However, in principle, the transparent zones 18 can have any shape, and can, for example, be punctiform, circular disc-shaped, or square. It is equally possible for the linear arrangement of the optically transparent zones 18 to be oriented at an angle different from 45° or 135° relative to the patterning zone 14. The design of the optically transparent zones 18 depicted in FIG. 2 along imaginary lines 19 enables particularly simple production using a pulsed laser beam, wherein the laser beam can be guided along the imaginary lines 19 advantageously from a process-technology standpoint.

As depicted in the following in FIGS. 5 and 6, in the optically transparent zones 18, for example, all layers of the layer structure 3 are removed all the way to the substrate 2 (i.e., rear electrode layer 5, absorber layer 6, buffer layer 7, and front electrode layer 8). However, it is conceivable that not all layers of the layer structure are removed in the transparent zones 18, with, in any case, the rear electrode layer 5 and, preferably, also the absorber layer 6 removed.

The photovoltaically active zones 17 of the solar cells 11 (i.e., layer regions 16 without optically transparent zones 18) are opaque and have here, for example, transmittance for visible light of less than 5%. In contrast to this, the optically transparent zones 18 have, for example, transmittance for visible light of at least 85%. The ratio of the total area of all optically transparent zones 18 to the total area of the solar cells 11 is in the range from 5% to 50%. Thus, the optical transparency of the semitransparent thin-film solar module averaged over the total area of the thin-film solar module 1 is also in the range from 5% to 50% and is, in particular, 20%.

The optically transparent zones 18 are arranged uniformly distributed along the imaginary lines 19 and over the thin-film solar module 1, whereby a very smooth overall visual effect can be obtained by means of the periodic pattern in two spatial directions. By means of the continuous rear electrode layer 5 in the layer regions 16, the advantages of the invention already mentioned in the introduction (e.g., low sensitivity to shading, avoidance of hot spots, potential compensation of layer inhomogeneities) can be achieved.

FIG. 3 is now considered, wherein another exemplary embodiment of the thin-film solar module 1 according to the invention is depicted in plan view. In order to avoid unnecessary repetition, only the differences relative to the exemplary embodiment of FIG. 2 are explained and, otherwise, reference is made to the statements concerning FIG. 2.

Accordingly, the optically transparent zones 18 have here in each case a circular shape and are arranged along imaginary lines 19 that are oriented parallel to the patterning zones 14. The optically transparent zones 18 of two adjacent imaginary lines 19 can be arranged offset relative to one another, wherein one optically transparent zone 18 of one linear arrangement is positioned at approx. the level of the gaps between two optically transparent zones 18 of the other linear arrangement. One imaginary line 19 is drawn in in FIG. 3 by way of example. One zone section 20 of the photovoltaically active zone 17 is always situated between two adjacent optically transparent zones 18 of one and the same layer region 16 that are arranged along one and the same imaginary line 19.

FIG. 4 depicts another exemplary embodiment of the thin-film solar module 1 according to the invention in plan view, with, again, only the differences relative to the exemplary embodiment of FIG. 2 explained and, otherwise, reference is made to the statements made there.

Accordingly, the optically transparent zones 18 have in each case a square shape and are arranged along imaginary lines 19 that are oriented parallel to the patterning zones 14. One imaginary line 19 is drawn in by way of example. The optically transparent zones 18 of two lines 19 adjacent one another are arranged offset relative to one another, wherein one optically transparent zone 18 of one line 19 is arranged precisely in the center of the gap between two optically transparent zones 18 of the other line 19 such that, overall, a checkerboard-like distribution of the optically transparent zones 18 over the layer regions 16 (i.e., solar cells 11) and the thin-film solar module 1 results.

FIGS. 5 and 6 are now considered, wherein an exemplary embodiment of an optically transparent zone 18 is depicted. The layer sequence is discernible in the sectional view of FIG. 6 along section line A-A of FIG. 5. Accordingly, in the optically transparent zone 18, for example, all layers of the layer structure 3, including the rear electrode layer 5 are removed. The optically transparent zone 18 is at least partially, preferably completely, surrounded by an edge zone 21. In the edge zone 21, all layers are, for example, removed, with the exception of the rear electrode layer 5. However, it is also conceivable that not all layers of the layer structure 3 are removed in both the optically transparent zone 18 and in the edge zone 21, wherein, in the optically transparent zone 18, in any case, the rear electrode layer is removed and in the edge zone 21, the rear electrode layer 5 is, in any case, not removed. By means of the edge zone 21, short-circuit paths (shunts) on the edges of the decoated areas can advantageously be avoided. Advantageously, the ratio of the total area of the optically transparent zones 18 to the total area of the end zones 21 is greater than 1, preferably greater than 10.

FIG. 7 illustrates an exemplary method for producing the thin-film solar module I according to the invention.

Accordingly, in step I, a substrate 2 with a layer structure 3 applied thereon with patterning zones 14 introduced therein for the formation of serially connected solar cells 11 is provided.

In step II, the optically transparent zones 18 are created by removal of all layers of the layer structure 3 all the way to the substrate 2 using a pulsed laser beam of a laser beam source. For this purpose, the layer structure 3 is irradiated with a pulsed laser beam, with pulses having a duration of less than 1 nanosecond. The layer structure 3 is preferably irradiated through the transparent substrate 2; however, direct irradiation of the layer structure 3 from the side facing away from the substrate 2 is also possible. Alternatively, the optically transparent zones 18 can be created by mechanical material removal. The optically transparent zones 18 do not completely subdivide the layer regions 16 such that the rear electrode layer 5 of the layer regions 16 is in each case continuous.

In an optional step III, edge zones 21 are created around the optically transparent zones 18. The edge zones 21 are created by irradiation of the layer structure 3 with a pulsed laser beam, with the pulses having a duration of less than 1 nanosecond, and/or by mechanical material removal. When edge zones 21 are created around the optically transparent zones 18, it is possible to also create the optically transparent zones 18 by irradiation with a pulsed laser beam, whose pulses have a duration of at least 1 nanosecond.

The invention makes available a thin-film solar module semitransparent to visible light. In at least one solar cell, there are, in addition to photovoltaically active zones, one or more optically transparent zones, wherein the rear electrode layer and preferably, also the absorber layer of the solar cell are implemented continuously. This enables, in particular, arranging a plurality of optically transparent zones in relatively complex patterns. A visually appealing division of the surface patterning into small parts can thus be realized in a simple manner. For example, patterns (e.g., periodic patterns) can be realized in two spatial directions, bringing the advantage of a smoother overall effect. Thus, a very appealing visual appearance of the thin-film solar module can be obtained. The continuous rear electrode layer prevents problems with local shading and sites of local overheating due to high current density. In addition, the disadvantageous effects of layer inhomogeneities can be avoided since the connected rear electrode serves as a potential-compensating surface.

As is evident from the above description, the invention advantageously enables technically relatively uncomplicated, highly versatile, and economical production of a semitransparent thin-film solar module, wherein a relatively large optically active area with comparatively high visible-light transmittance of the thin-film solar module can be obtained.

LIST OF REFERENCE CHARACTERS 1 thin-film solar module
2 first substrate
3 layer structure
4 module surface
5 rear electrode layer
6 absorber layer
7 buffer layer
8 front electrode layer
9 adhesive layer
10 second substrate
11 solar cell
12 composite
13 connection section
14 patterning zone
15 dead zone
16 layer region
17 photovoltaically active zone
18 optically transparent zone
19 imaginary line
20 zone section
21 edge zone

What is claimed is:

1. A thin-film solar module, comprising:
a first substrate and a layer structure applied thereon, the layer structure comprising a rear electrode layer, a front electrode layer, an absorber layer arranged between the rear electrode layer and the front electrode layer, and a buffer layer deposited on the absorber layer, wherein the front electrode layer is deposited on the buffer layer such that a heterojunction is formed by the front electrode layer, the buffer layer, and the absorber layer;
serially connected solar cells formed in the layer structure by patterning zones,
at least one solar cell of the serially connected solar cells having one or more optically transparent zones implemented;

the rear electrode layer is directly attached on the first substrate, and the first substrate is continuous through the at least one solar cell; wherein,
the one or more optically transparent zones have no absorber layer and have no rear electrode layer; wherein,
at least one optically transparent zone of the one or more optically transparent zones is a square shape, and the at least one optically transparent zone is surrounded by an immediately adjacent absorber-layer-free edge zone, wherein the edge zone has no absorber layer but comprises the rear electrode layer;
a second substrate transparent to sunlight; and
a thermoplastic adhesive layer encapsulates the layer structure and is bonded between the first substrate and the second substrate.

2. The thin-film solar module according to claim 1, wherein a ratio of total area of the optically transparent zones to total area of the edge zones is greater than 1.

3. The thin-film solar module according to claim 1, wherein the serially connected solar cells include the one or more optically transparent zones.

4. The thin-film solar module according to claim 1, wherein the one or more optically transparent zones are a plurality of optically transparent zones arranged along at least one imaginary line.

5. The thin-film solar module according to claim 4, wherein a first set of optically transparent zones are arranged along a first group of mutually parallel lines, and a second set of optically transparent zones are arranged along at least one second group of mutually parallel lines, wherein lines of the first group and lines of the second group are oriented at angles different from one another relative to the patterning zones.

6. The thin-film solar module according to claim 1, wherein a ratio of total area of the optically transparent zones to total area of the serially connected solar cells is in a range from 0.05 to 0.5.

7. The thin-film solar module according to claim 1, wherein the one or more optically transparent zones have a checkerboard pattern.

8. The thin-film solar module according to claim 5, wherein the first set of optically transparent zones arranged along the first group of mutually parallel lines are oriented in each case at an angle of 45° to the patterning zones.

9. The thin-film solar module according to claim 5, wherein the second set of optically transparent zones arranged along the second group of mutually parallel lines are oriented in each case at an angle of 135° to the patterning zones.

10. The thin-film solar module according to claim 1, wherein the optically transparent zones have transmittance for visible light of at least 85%.

* * * * *